US009117956B2

(12) United States Patent
Clark et al.

(10) Patent No.: US 9,117,956 B2
(45) Date of Patent: Aug. 25, 2015

(54) METHOD OF CONTROLLING THE AMOUNT OF CU DOPING WHEN FORMING A BACK CONTACT OF A PHOTOVOLTAIC CELL

(75) Inventors: Laura Anne Clark, Brighton, CO (US); Tammy Jane Lucas, Highlands Ranch, CO (US); Wyatt Keith Metzger, Louisville, CO (US); Samuel H. Demtsu, Thornton, CO (US); David Joseph Dickerson, Thornton, CO (US); Laura Jean Wilson, Peyton, CO (US); Mehran Sadeghi, Orpington (GB)

(73) Assignee: First Solar, Inc., Tempe, AZ (US)

( * ) Notice: Subject to any disclaimer, the term of this patent is extended or adjusted under 35 U.S.C. 154(b) by 24 days.

(21) Appl. No.: 13/600,987

(22) Filed: Aug. 31, 2012

(65) Prior Publication Data
US 2014/0065762 A1    Mar. 6, 2014

(51) Int. Cl.
*H01L 21/00* (2006.01)
*H01L 31/073* (2012.01)
*H01L 31/18* (2006.01)

(52) U.S. Cl.
CPC .......... *H01L 31/073* (2013.01); *H01L 31/1864* (2013.01); *Y02E 10/543* (2013.01)

(58) Field of Classification Search
CPC .. H01L 31/073; H01L 31/1864; Y02E 10/543
USPC ........................................................ 438/667
See application file for complete search history.

(56) References Cited

U.S. PATENT DOCUMENTS

| 5,557,146 | A | 9/1996 | Britt et al. | |
|---|---|---|---|---|
| 8,143,515 | B2 * | 3/2012 | Gossman et al. | 136/256 |
| 2010/0184249 | A1 | 7/2010 | Chen | |
| 2010/0212731 | A1 | 8/2010 | Abken | |
| 2010/0261304 | A1 | 10/2010 | Chang | |
| 2011/0143489 | A1 | 6/2011 | Korevaar | |
| 2011/0143490 | A1 | 6/2011 | O'Keefe | |
| 2011/0143493 | A1 | 6/2011 | Feldman-Peabody et al. | |
| 2011/0155207 | A1 | 6/2011 | Singh | |
| 2011/0209763 | A1 | 9/2011 | Cho | |
| 2011/0259423 | A1 | 10/2011 | Korevaar et al. | |
| 2012/0028409 | A1 | 2/2012 | Lucas et al. | |

FOREIGN PATENT DOCUMENTS

| EP | 1433207 B1 | 8/2009 |
|---|---|---|
| EP | 2333844 A2 | 6/2011 |

(Continued)

OTHER PUBLICATIONS

International Search Report and Written Opinion, dated Jan. 7, 2014, from the International Searching Authority in corresponding PCT Application No. US13/57668.

*Primary Examiner* — Richard Booth
(74) *Attorney, Agent, or Firm* — MacMillan, Sobanski & Todd, LLC (57) ABSTRACT

Methods for preparing an exposed surface of a p-type absorber layer of a p-n junction for coupling to a back contact in the manufacture of a thin film photovoltaic device are provided. The method can include: applying a treatment solution onto the exposed surface defined by the p-type absorber layer of cadmium telluride; and annealing the device with the p-type absorber layer in contact with the treatment solution to form a tellurium-enriched region in the p-type absorber layer at the exposed surface. The treatment solution comprises a chlorinated compound component that is substantially free from copper, a copper-containing metal salt, and a solvent.

19 Claims, 2 Drawing Sheets

(56) References Cited

FOREIGN PATENT DOCUMENTS

| | | | |
|---|---|---|---|
| EP | 2337084 | A2 | 6/2011 |
| EP | 2337088 | A2 | 6/2011 |
| EP | 2337091 | A2 | 6/2011 |
| WO | 2007129097 | A2 | 11/2007 |
| WO | 2010099047 | A1 | 9/2010 |

* cited by examiner

METHOD OF CONTROLLING THE AMOUNT OF CU DOPING WHEN FORMING A BACK CONTACT OF A PHOTOVOLTAIC CELL

FIELD OF THE INVENTION

The subject matter disclosed herein relates generally to methods of controlling the amount of copper (Cu) when forming a back contact of a photovoltaic device.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type absorber layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type absorber layer (i.e., an electron accepting layer) and the CdS layer acts as an n-type layer (i.e., an electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type absorber layer, such as the cadmium telluride layer in a CdTe PV device.

Due to the high work function of CdTe, conventional metal back contacts are not generally viewed as being suitable. Instead, graphite pastes (either undoped or doped, for example with copper or mercury) are widely used as a back contact for CdTe PV cells. However, these graphite-paste back contacts tend to degrade significantly over time, as can be shown via accelerated lifetime testing. This degradation typically manifests itself as a decrease over time in fill factor (FF) and/or open circuit voltage ($V_{OC}$). The fill factor degradation is typically driven by a decrease in shunt resistance ($R_{sh}$) and an increase in the series resistance ($R_{OC}$) over time. The degradation of the back contact electrodes undesirably leads to degradation of the solar cell efficiency, on a long-term basis.

A long held understanding of CdTe back contacts made from copper and completed with a conductive paste is that such back contacts need to have some tellurium enriching attribute/mechanism in order to form a good ohmic back contact, either as a separate etching process by directly depositing a Te-rich layer or as a result of by-products formed during the conductive paste cure. A common theme among these processes is that they perform the Te etching and the Cu doping in two separate processes. While the introduction of copper into the back contact has been known, it is also known that the presence of copper in the final device may lead to the degradation of the device efficiency over time.

It would be desirable to use an approach where the back contact step creates the Te-rich layer and performs the Cu doping during a single processing step. It would therefore be desirable to provide a copper-containing back contact electrode for a CdTe PV cell, which exhibits less degradation over the lifetime of the PV cell. It would further be desirable to provide an economical method for forming the improved back contact electrode, in order to facilitate commercialization of CdTe PV cells.

BRIEF DESCRIPTION OF THE INVENTION

Aspects and advantages of the invention will be set forth in part in the following description, or may be obvious from the description, or may be learned through practice of the invention.

Methods are generally provided for preparing an exposed surface of a p-type absorber layer of a p-n junction for coupling to a back contact in the manufacture of a thin film photovoltaic device. In one embodiment, the method includes: applying a treatment solution onto the exposed surface defined by the p-type absorber layer of cadmium telluride; and annealing the device with the p-type absorber layer in contact with the treatment solution to form a tellurium-enriched region in the p-type absorber layer at the exposed surface. The treatment solution generally comprises a chlorinated compound component that is substantially free from copper, a copper-containing metal salt, and a solvent.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

Methods are generally provided for preparing an exposed surface of a p-type absorber layer of a p-n junction for coupling to a back contact in the manufacture of a thin film photovoltaic device. The methods are particularly suitable for forming a tellurium enriched surface on a p-type absorber layer that includes cadmium telluride. As discussed in greater detail below, the treatment solution generally includes a chlorinated compound component, a copper-containing metal salt, and a solvent. The chlorinated compound component and the copper-containing metal salt work together to create a tellurium-rich (Te-rich) surface on the p-type absorber layer by forming small amounts of acid(s) that etch the surface. The copper (Cu) from the copper-containing metal salt allows for a CuTe phase to be formed simultaneously in a single treatment step, while allowing for a relatively low concentration of Cu to be included within the treatment solution. As such, the amount of excess Cu in the device can be controlled while still realizing the advantage of forming an enriched phase (e.g., CuTe) at the surface of the p-type absorber layer.

Figure 1:
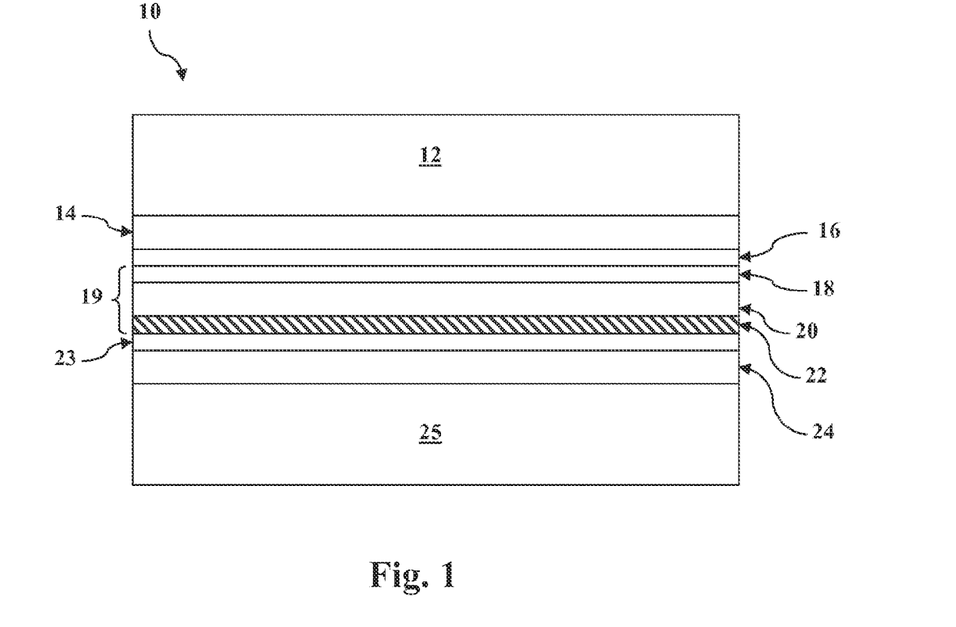
FIG. 1 shows a general schematic of a cross-sectional view of an exemplary cadmium telluride thin film photovoltaic device according to one embodiment of the present invention; and, FIG. 2 shows another cross-sectional view of the exemplary cadmium telluride thin film photovoltaic device shown in FIG. 1 prior to treatment with a treatment solution according to one embodiment.

FIG. 1 shows a cross-section of an exemplary cadmium telluride based thin-film photovoltaic device 10. The device 10 is shown including a transparent substrate 12 (e.g., a glass substrate), a transparent conductive oxide (TCO) layer 14, a resistive transparent buffer layer 16, an n-type layer 18 (e.g., a cadmium sulfide layer), a p-type absorber layer 20 (e.g., a cadmium telluride layer), an optional conductive paste layer 23 (e.g., a graphite layer), and a metal contact layer 24. The n-type layer 18 and the p-type absorber layer 20 generally form a p-n junction 19 in the device 10.

According to one embodiment, a treatment solution can be applied onto the exposed surface 21 of the p-type absorber layer 20 prior to applying or forming the back contact (i.e., the conductive paste layer 23 and/or the metal layer 24) thereon. The device 10 can then be annealed with the p-type absorber layer 20 in contact with the treatment solution to enrich the surface 21 with tellurium.

Such a treatment method can generally form a Te-enriched region 22 within the p-type absorber layer 20. The Te-enriched region 22 can have, for example, an atomic ratio of tellurium to cadmium of greater than about 2 (e.g., about greater than about 10).

The treatment solution generally includes a chlorinated compound component, a copper-containing metal salt, and a solvent system (e.g., methanol, ethanol, water, or the like, or combinations thereof). Upon contact with the exposed surface 21 and annealing, the chlorinated compound component can form small amounts of an acid etch the surface and create the tellurium-enriched region 22 defining a Te-rich surface 21. With the chlorinated compound component serving as an etchant forming the Te-rich surface, the presence of copper in the same treatment solution allows a CuTe phase to be formed simultaneously. Thus, a relatively low amount of copper need be added to the surface 21 to form the CuTe phase, leading to minimizing the amount of excess Cu introduced into the device 10.

The chlorinated compound component generally includes any compound (or mixture) that includes chlorine and is soluble in the solvent or solvent system of the treatment device. Particularly suitable chlorinated compounds include, but are not limited to, $ZnCl_2$, $CdCl_2$, $MnCl_2$, $SbCl_2$, $CaCl_2$, $MgCl_2$, $NaCl$, $KCl$, $RbCl$, $BeCl_2$, $SrCl_2$, $BaCl_2$, $AsCl_3$, $BiCl_3$, $HCl$, or a mixture thereof. In one embodiment, the chlorinated compound is chlorinated salt (e.g., $ZnCl_2$, $CdCl_2$, $MnCl_2$, $SbCl_2$, $CaCl_2$, $MgCl_2$, $NaCl$, $KCl$, $RbCl$, $BeCl_2$, $SrCl_2$, $BaCl_2$, $AsCl_3$, $BiCl_3$, or a mixture thereof).

In certain embodiments, the chlorinated compound component of the treatment solution can be a mixture of at least two chlorinated compounds (e.g., a mixture of two chlorinated salts: a first chlorinated salt and a second chlorinated salt) having different chemical compositions. For instance, the chlorinated compound component of the treatment solution can be a mixture of at least three chlorinated compounds (a mixture of three chlorinated salts: a first chlorinated salt, a second chlorinated salt, and a third chlorinated salt) having different chemical compositions. In one particular embodiment, the chlorinated compound component can include at least one of $ZnCl_2$, $CdCl_2$, and/or $MnCl_2$.

The chlorinated compound component can be included in the treatment solution at a concentration of about 10 g/L to about 1000 g/L (e.g., about 25 g/L to about 500 g/L).

In one particular embodiment, the chlorinated compound component is substantially free from copper so as to not add any additional amount of copper to the device 10. As used herein, the term "substantially free" means no more than an insignificant trace amount present and encompasses completely free (e.g., 0 weight % up to 0.001 weight %). Thus, copper chloride is expressly excluded in certain embodiments from being a chlorinated compound component.

In one embodiment, the chlorinated compound component can be substantially free from nitrogen. For example, the treatment solution is generally acidic, and not basic, and would not be particularly receptive to the inclusion of a nitrogen hydroxide compound (e.g., $NH_4OH$) due to such a basic compound inhibiting the chlorinated etching process. Conversely, common acids containing nitrogen, such as nitric acid ($HNO_3$), are aggressive and could result in over etch the surface 21 of the p-type absorber layer 20, negatively affecting the initial efficiency and stability of the solar cell.

The copper-containing metal salt of the treatment solution reacts with the Te-enriched surface 21 as it is being formed via the etching action of the chlorinated compound component to form a copper-telluride phase (e.g. CuTe, $Cu_2Te$, $CuTe_2$, etc.) on the surface 21. This copper-telluride phase is, as discussed above, formed without providing excess copper to the p-type absorber layer 20 or other layers of the device 10. The copper-containing metal salt can be any suitable copper composition (or mixture of compositions) that is soluble in the solvent or solvent system and that can readily release the copper atom/ion for formation of the copper-telluride phase. For example, the copper-containing metal salt can be a copper halide (e.g., $CuF_2$, $CuCl_2$, $CuBr_2$, $CuI_2$, or mixtures thereof), a copper acetate, a copper sulfide, or a mixture thereof.

As stated, the amount of copper in the treatment composition can be minimized to limit the amount of excess copper that remains in the device 10. The total concentration of the copper containing metal salt(s) in the treatment solution is, in particular embodiments, about 0.001 g/L to about 10 g/L (e.g., about 0.01 g/L to about 1 g/L).

In certain embodiments, the treatment solution includes the chlorinated compound component and the copper-containing metal salt at a weight ratio (calculated by dividing the total weight of the chlorinated compound component by the total weight of the copper-containing metal salt) of about 100 to about 10,000 by weight (i.e., about 100 times by weight more of the chlorinated compound component than the copper-containing metal salt to about 10,000 times by weight more of the chlorinated compound component than the copper-containing metal salt), such as about 250 to about 5000. In one particular embodiment, the treatment solution includes the chlorinated compound component and the copper-containing metal salt at a weight ratio of about 300 to about 3,000 by weight. Thus, the amount of the copper-containing metal salt is relatively low, when compared to the amount of the chlorinated compound component.

After applying the treatment solution onto the exposed surface 21, the treatment composition can generally react with the surface 21 in such a manner as to enrich the surface with Te during the application of an energy source in curing (e.g., heat, light, sonication, microwave, etc. . . . ). Thus, the degree of Te enrichment of the surface 21 can be controlled by the amount of energy applied. Alternatively or additionally, the degree of Te enrichment of the surface 21 can be controlled by limiting the amount of acid or acid-generator initially present within the treatment composition. In one embodiment, annealing can be performed via heating the device 10 to a temperature of about 45° C. to about 250° C. for about 0.5 minutes to about 60 minutes. In certain embodiments, the tellurium-enriched region 22 formed has a thickness of about 10 nanometers to about 1000 nanometers.

The back contact in the illustrated embodiment is formed from the optional conductive paste layer 23 and a metal contact layer 24, as is shown on the absorber layer 20. The back contact generally serves as the opposite electrical contact, in relation to the TCO layer 14 serving as the front electrical contact. The back contact is formed on, and in one embodiment is in direct contact with, the surface 21 of the cadmium telluride layer 20.

Due to the prior application of the treatment solution, any additional chemical modification of the exposed surface 21 is not required, and such an additional medication could, indeed, alter the desired/controlled stoichiometry of the surface 21. Accordingly, after annealing, the back contact 23, 24 can be applied directly onto and directly coupled with the treated surface 21, without, in certain embodiments, any additional etchant of the surface 21 or copper treatment to the p-type absorber layer 20. For example, the back contact can include a metal and/or an inert graphite, and can be, in certain embodiments, substantially free from a chemically active material (e.g., substantially free from a chemically active graphite), particularly an acid generator.

In one embodiment, a thin film photovoltaic device 10 is generally provided having a conductive paste layer 23 (e.g., including an inert graphite) as the back contact or as part of the back contact. For example, the conductive paste layer 23 can be utilized between the p-n junction of the thin film PV device 10 and a metal contact layer 24. In particular, the conductive paste layer 23 can be utilized between the p-type absorber layer 20 (e.g., a cadmium telluride layer) of the thin film PV device 10 and the metal contact layer 24. The conductive paste layer 23 can generally provide improved adhesion to and/or contact between a cadmium telluride thin film layer 20 of a cadmium telluride based thin film PV device 10 and the back electrical contact 24. Such a conductive paste layer 23 can be formed by applying a paste that includes a conductive material, a polymeric binder, and a solvent.

The conductive material can be any material with a work function or electron affinity that closely matches that of CdTe. Since the work function of CdTe is about 5.5 eV, the desired material should have a work function greater than 4 eV. Additionally, the conductivity of this material should be greater than $1 \times 10^2 \, \Omega^{-1} m^{-1}$. Some examples of materials that fall into the work function and conductivity parameters and that are known to perform well for CdTe include graphite carbon, Ni and its compounds, Mo and its compounds, Zn and its compounds, and Ti and its compounds, Tc and its compounds, Cr and its compounds. As such, in one particular embodiment, the conductive material can include at least one of graphite carbon or a metallic conductive material (e.g., Ni, Mo, Zn, Ti, Tc, Cr, or alloys, or organic derivatives thereof).

The polymeric binder in the conductive paste layer 23 generally provides a base material to secure the conductive material within the resulting device 10 and can act as an adhesive layer between the metal contact layer 24 and the p-type absorber layer 20. In one particular embodiment, the polymeric binder is a chlorinated polymeric binder or another halogenated polymer binder. The polymeric binder can generally include at least one organic polymer (i.e., containing a carbon backbone) or a combination of polymers forming a polymer system. As used herein, the term "polymer" generally includes, but is not limited to, homopolymers; copolymers, such as, for example, block, graft, random and alternating copolymers; and terpolymers; and blends and modifications thereof. Furthermore, unless otherwise specifically limited, the term "polymer" shall include all possible geometrical configurations of the material. These configurations include, but are not limited to isotactic, syndiotactic, and random symmetries.

The solvent system in the conductive paste can include at least one solvent that is configured to help apply the polymeric binder and/or the conductive material onto the surface 21 of the p-type absorber layer 20 during processing. As such, the particular solvent(s) can be selected based on the particular composition of the polymeric binder and/or the conductive material utilized in the conductive paste. The solvent can be substantially removed after applying the conductive paste to the surface 21 during subsequent processing (e.g., during curing) such that the resulting device 10 is substantially free from the solvent. Suitable solvents can include, but are not limited to dimethyl succinate, dimethyl glutarate, or mixtures thereof. In one particular embodiment, the solvent system includes at least one chlorinated solvent.

The conductive paste can be applied onto the surface 21 of the p-type absorber layer 20 during processing of the device 10 by any suitable method for spreading the blend or paste, such as screen printing, spraying or by a "doctor" blade. After the application of the conductive paste to the p-type absorber layer 20, the conductive paste can be cured to convert the conductive paste into the conductive paste layer 23. Such a curing process can evaporate the solvent system present in the as-applied conductive paste and/or crosslink the polymeric binder to secure and/or bond the conductive paste layer 23 on the surface 21.

The conductive paste layer 23 can have, for instance, a thickness (in the z-direction defined from the surface 21 of the p-type absorber layer 20 to the metal contact layer 24) of about 0.1 micrometers ($\mu m$) to about 15 $\mu m$, such as about 3 $\mu m$ to about 8 $\mu m$.

In one particular embodiment, the conductive paste layer 23 can include an inert graphite paste, in that the paste is substantially free from any chemical that would significantly alter the chemical components of the exposed layer 21 (e.g., an acid or an acid generator). In such an embodiment, the back contact can substantially free from a chemically active graphite paste.

After the application of the graphite blend or carbon paste, the device 10 can be heated to convert the blend or paste into the conductive paste layer 23. The conductive paste layer 23 can be, in particular embodiments, from about 0.1 $\mu m$ to about 10 $\mu m$ in thickness, for example from about 1 $\mu m$ to about 5 $\mu m$.

Figure 2:
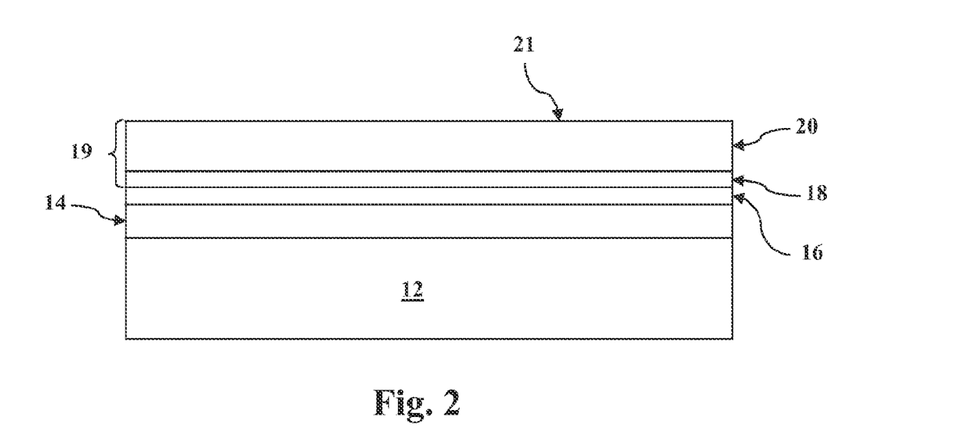
Figure 3:
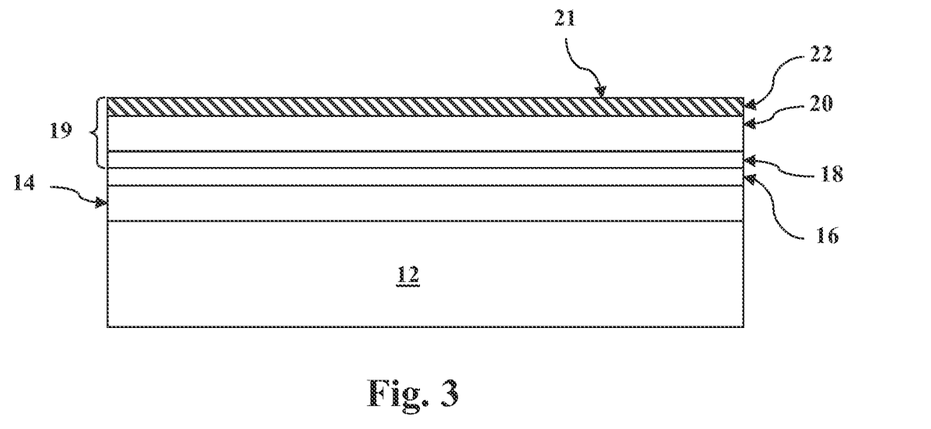
FIG. 3 shows a cross-sectional view of the exemplary cadmium telluride thin film photovoltaic device shown in FIG. 2 after treatment with a treatment solution according to one embodiment; and, FIG. 4 shows a cross-sectional view of the exemplary cadmium telluride thin film photovoltaic device shown in FIG. 3 after formation of a conductive paste layer in the formation of the back contact.
Figure 4:
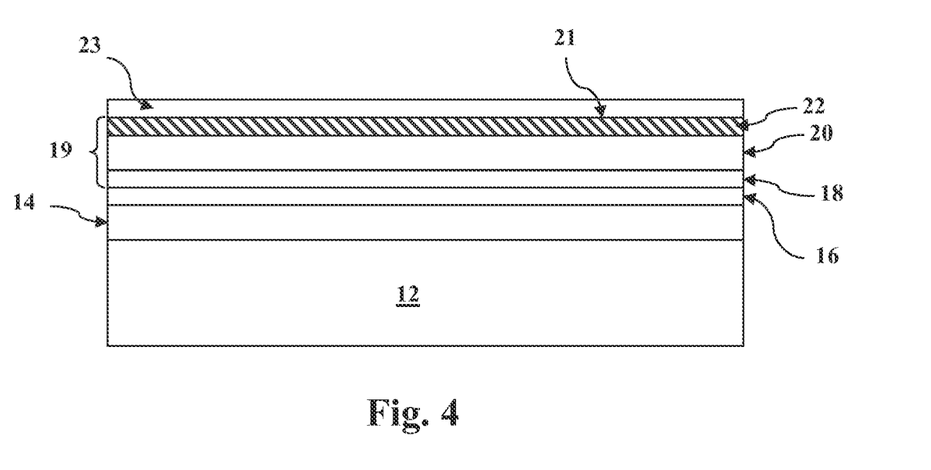

Generally, the treatment solution and method can be used in the formation of any cadmium telluride thin film photovoltaic device 10, such as the exemplary device 10 shown in FIGS. 1-2. The exemplary device 10 of FIGS. 1-2 includes a transparent substrate 12 of glass. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmission of about 90% or greater in the spectrum of interest (e.g., wavelengths from about 300 nm to about 900 nm).

The transparent conductive oxide (TCO) layer 14 is shown on the transparent substrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 $\mu m$ and about 1 $\mu m$, for example from about 0.1 $\mu m$ to about 0.5 $\mu m$, such as from about 0.25 $\mu m$ to about 0.45 $\mu m$. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 20. Thus, it is believed that the RTB layer 16 allows for improved adhesion and/or interaction between the TCO layer 14 and the cadmium telluride layer 20, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The cadmium sulfide layer 18 is shown on resistive transparent buffer layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 40 nm to about 80 nm, with a minimal presence of pinholes between the resistive transparent layer 16 and the cadmium sulfide layer 18. Additionally, a cadmium sulfide layer 18 having a thickness less than about 0.1 μm reduces any adsorption of radiation energy by the cadmium sulfide layer 18, effectively increasing the amount of radiation energy reaching the underlying cadmium telluride layer 20.

The cadmium telluride layer 20 is shown on the cadmium sulfide layer 18 in the exemplary cadmium telluride thin film photovoltaic device 10 of FIG. 1. The cadmium telluride layer 20 is a p-type absorber layer that generally includes cadmium telluride (CdTe) but may also include other materials. As the p-type absorber layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 μm and about 10 μm, such as from about 1 μm and about 5 μm. In one particular embodiment, the cadmium telluride layer 20 can have a thickness between about 2 μm and about 4 μm, such as about 3 μm.

A series of post-forming treatments can be applied to the exposed surface of the cadmium telluride layer 20. These treatments can tailor the functionality of the cadmium telluride layer 20 and prepare its surface for subsequent adhesion to the back contact layers, particularly the conductive paste layer 23. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type absorber layer of cadmium telluride. Without wishing to be bound by theory, it is believed that annealing the cadmium telluride layer 20 (and the device 10) converts the weakly p-type cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as $CdO$, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface. In one embodiment, the application of the treatment solution described above, and its subsequent annealing, can be performed after annealing the cadmium telluride layer 20 in the presence of cadmium chloride and washing the surface 21.

As stated, the back contact is formed from the conductive paste layer 23 and the metal contact layer 24 shown on the cadmium telluride layer 20 and generally serves as the back electrical contact, in relation to the opposite, TCO layer 14 serving as the front electrical contact. The back contact is formed on, and in one embodiment is in direct contact with, the cadmium telluride layer 20. The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

Other layers may also be present in the thin film stack, although not specifically shown in the embodiment of FIGS. 1 and 2. For example, index matching layers may be present between the transparent conductive oxide layer 14 and the superstrate 12. Additionally, an oxygen getter layer may be present in the thin film stack, such as adjacent to the transparent conductive oxide layer 14 (e.g., between the transparent conductive oxide layer 14 and the optional resistive transparent buffer layer 16).

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells, as described above with respect to FIG. 1.

An encapsulating substrate 25 is laminated to the transparent substrate 12 to complete the device 10.

Methods for forming a photovoltaic device are also generally provided.

EXAMPLES

Photovoltaic devices were prepared, as shown in FIG. 2 and described above. Specifically, each device included a TCO layer of sputtered from cadmium tin oxide, a RTB layer sputtered from zinc tin oxide, a n-type window layer sputtered from cadmium sulfide. A p-type absorber layer of cadmium telluride was formed via closed space sublimation, and then treated with $CdCl_2$ and washed with DAE, prior to the subsequent treatment described with reference to each Example below. Each photovoltaic device Example 1

Mixtures of $CuCl_2$ and $CdCl_2$ were sprayed (20 sec) onto the exposed surface of the p-type absorber layer according to the following concentrations: (1a) 37.5 g/L $CdCl_2$ and 0.1 g/L $CuCl_2$; (1b) 75 g/L $CdCl_2$ and 0.1 g/L $CuCl_2$; (1c) 150 g/L $CdCl_2$ and 0.1 g/L $CuCl_2$; and (1d) 150 g/L $CdCl_2$ and 0.05 g/L $CuCl_2$.

Samples were annealed at either 175° C. or 185° C. for 20 minutes, first condition was also annealed at 200° C. for 10 minutes. The samples were then rinsed and an inert graphite layer and metal layer were applied. As a control, a sample was annealed with $CuCl_2$ (1.8 g/L at 175° C. for 20 minutes) and an inert graphite and metal layer were applied.

The highest efficiency (about 13.7%) and fill factor (about 72-73) was obtained with sample 1c (150 g/L CdCl2 and 0.1 g/L CuCl2 annealed at 185° C.). Fill factor appeared to increase with increase in $CdCl_2$ concentration and higher Cu concentration. Voc appeared to increase with higher temperature and lower Cu concentration.

Example 2

Mixtures of $CuCl_2$ and $MnCl_2$ were sprayed (20 sec) onto the exposed surface of the p-type absorber layer according to the following concentrations: (2a) 26 g/L $MnCl_2$ and 0.1 g/L $CuCl_2$; (2b) 26 g/L $MnCl_2$ and 0.45 g/L $CuCl_2$; (2c) 105 g/L $MnCl_2$ and 0.1 g/L $CuCl_2$; and (2d) 150 g/L $MnCl_2$ and 0.1 g/L $CuCl_2$.

Samples were annealed at either 175° C. or 185° C. for 20 minutes. The samples were then rinsed and an inert graphite layer and metal layer were applied. As a control, a sample was annealed with $CuCl_2$ (1.8 g/L at 175° C. for 20 minutes) and an inert graphite and metal layer were applied.

The highest efficiency was obtained with samples 2c and 2d annealed at 185° C. At 175° C., the highest performing condition was 2b.

Example 3

Mixtures of $CuCl_2$ and $ZnCl_2$ were sprayed (20 sec) onto the exposed surface of the p-type absorber layer according to the following concentrations: (3a) 30.5 g/L $ZnCl_2$ and 0.45 g/L $CuCl_2$; (3b) 30.5 g/L $ZnCl_2$ and 0.1 g/L $CuCl_2$; (3c) 121 g/L $ZnCl_2$ and 0.1 g/L $CuCl_2$; and (3d) 150 g/L $ZnCl_2$ and 0.1 g/L $CuCl_2$.

Samples were annealed at either 175° C. or 185° C. for 20 minutes. The samples were then rinsed and an inert graphite layer and metal layer were applied. As a control, a sample was annealed with $CuCl_2$ (1.8 g/L at 175° C. for 20 minutes) and an inert graphite and metal layer were applied.

The highest efficiency was obtained with samples 3a, for both annealing temperatures. Fill factor increased with increase in $CuCl_2$ concentration and temperature, decrease in $ZnCl_2$ concentration. Voc increased with decrease in $CuCl_2$ concentration and increase in $ZnCl_2$ concentration. Voc's higher for lower $ZnCl_2$ concentrations and 0.45 g/L $CuCl_2$ were almost equivalent to higher $ZnCl_2$ concentration with 0.1 g/L $CuCl_2$ Voc's.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of preparing an exposed surface of a p-type absorber layer of a p-n junction for coupling to a back contact in the manufacture of a thin film photovoltaic device, the method comprising:
applying a treatment solution onto the exposed surface defined by the p-type absorber layer, wherein the p-type absorber layer comprises cadmium telluride, and wherein the treatment solution comprises a chlorinated compound component, a copper-containing metal salt, and a solvent, wherein the chlorinated compound component is substantially free from copper and comprises a mixture of a first chlorinated salt and a second chlorinated salt, wherein the second chlorinated salt has a different chemical composition than the first chlorinated salt; and,
annealing the device at a temperature of about 45° C. to about 250° C. with the p-type absorber layer in contact with the treatment solution to simultaneously form a tellurium-enriched region in the p-type absorber layer at the exposed surface and a copper-telluride phase in the tellurium enriched region.

2. The method as in claim 1, further comprising:
after annealing, directly coupling a back contact to the tellurium-enriched region.

3. The method as in claim 2, wherein the back contact is applied without any additional copper treatment to the p-type absorber layer.

4. The method as in claim 2, further comprising:
prior to applying the treatment solution on the exposed surface, annealing the p-type absorber layer in the presence of cadmium chloride; and,
washing the exposed surface to remove any cadmium oxide formed thereon.

5. The method as in claim 4, wherein washing the exposed surface is achieved with ethylenediamine.

6. The method as in claim 2, wherein the back contact comprises a metal or an inert graphite, and wherein the back contact is substantially free from a chemically active graphite.

7. The method as in claim 2, wherein the back contact is applied without any additional etchant applied to the exposed surface of the p-type absorber layer.

8. The method as in claim 1, wherein the copper containing metal salt is in the treatment solution at a concentration of about 0.001 g/L to about 10 g/L.

9. The method as in claim 1, wherein the copper containing metal salt is in the treatment solution at a concentration of about 0.01 g/L to about 1 g/L.

10. The method as in claim 1, wherein the chlorinated compound component is in the treatment solution at a concentration of about 10 g/L to about 1000 g/L.

11. The method as in claim 1, wherein the chlorinated compound component is in the treatment solution at a concentration of about 25 g/L to about 500 g/L.

12. The method as in claim 1, wherein the treatment solution includes the chlorinated compound component and the copper-containing metal salt at a weight ratio of about 100 to about 10,000 by weight.

13. The method as in claim 1, wherein the treatment solution is acidic and has a pH of about 0 up to 7.

14. The method as in claim 1, wherein the chlorinated compound component comprises $ZnCl_2$, $CdCl_2$, $MnCl_2$, $SbCl_2$, $CaCl_2$, $MgCl_2$, NaCl, KCl, RbCl, $BeCl_2$, $SrCl_2$, $BaCl_2$, $AsCl_3$, $BiCl_3$, or a mixture thereof.

15. The method as in claim 1, wherein the chlorinated compound component comprises a mixture of a first chlorinated salt, a second chlorinated salt, and a third chlorinated salt, wherein the each of the first chlorinated salt, the second chlorinated salt, and the third chlorinated salt has a different chemical composition.

16. The method as in claim 1, wherein the copper-containing metal salt comprises a copper halide, a copper acetate, a copper-sulfur compound, or a mixture thereof.

17. The method as in claim 1, wherein the copper-containing metal salt comprises a copper halide selected from the group consisting of $CuF_2$, $CuCl_2$, $CuBr_2$, $CuI_2$, and mixtures thereof.

18. The method as in claim 1, wherein the chlorinated compound component comprises $ZnCl_2$, $CdCl_2$, $MnCl_2$, or a mixture thereof, and wherein the copper copper-containing metal salt comprises a copper halide.

19. The method as in claim 1, wherein annealing the device comprises heating the device to a temperature of about 45° C. to about 250° C. for about 0.5 minutes to about 60 minutes.

* * * * *